US005289363A

United States Patent [19]
Ferchau et al.

[11] Patent Number: 5,289,363
[45] Date of Patent: Feb. 22, 1994

[54] MODULAR POWER SUPPLY ARRANGEMENT WITH COOLING

[75] Inventors: Joerg Ferchau, Morgan Hill; Victor Trujillo, Fremont, both of Calif.

[73] Assignee: Tandem Computers, Inc., Cupertino, Calif.

[21] Appl. No.: 943,344

[22] Filed: Sep. 10, 1992

Related U.S. Application Data

[62] Division of Ser. No. 726,616, Jul. 8, 1991, Pat. No. 5,207,613.

[51] Int. Cl.⁵ .............................................. H02M 7/06
[52] U.S. Cl. ....................................... 363/141; 361/689; 361/730
[58] Field of Search ............... 454/184; 361/384, 390, 361/391, 394; 165/80.3, 104.33; 363/141, 144

[56] References Cited

U.S. PATENT DOCUMENTS

| | | |
|---|---|---|
| 3,039,377 | 6/1962 | Wernli . |
| 3,137,212 | 6/1964 | Rose . |
| 3,177,404 | 4/1965 | Patmore . |
| 3,198,991 | 8/1965 | Barnett . |
| 3,218,518 | 11/1965 | Ashbridge . |
| 3,280,377 | 10/1966 | Harris . |
| 3,387,648 | 6/1968 | Ward .................... 165/47 |
| 3,483,433 | 12/1969 | Ettinger ................. 363/144 |
| 3,566,190 | 2/1971 | Huebner . |
| 3,818,283 | 6/1974 | Ward . |
| 3,949,277 | 4/1976 | Yosset . |
| 3,956,673 | 5/1976 | Seid ...................... 62/418 |
| 3,982,584 | 9/1976 | Spanoudis ............... 165/42 |
| 4,002,955 | 1/1977 | Eggert . |
| 4,148,534 | 4/1979 | Veburg .................. 361/384 |
| 4,149,218 | 4/1979 | Carrubba ............... 361/383 |
| 4,152,750 | 5/1979 | Bremenour ............ 361/383 |
| 4,158,875 | 6/1979 | Tajima . |
| 4,215,386 | 7/1980 | Prager .................... 361/394 |
| 4,251,853 | 2/1981 | Sites ...................... 361/394 |
| 4,342,002 | 7/1982 | Gabr ...................... 361/394 |
| 4,442,475 | 4/1984 | Franklin ................ 361/383 |
| 4,493,010 | 1/1985 | Morrison et al. ...... 361/385 |
| 4,520,424 | 5/1985 | Carpenter .............. 361/383 |
| 4,528,614 | 7/1985 | Shariff ................... 361/379 |
| 4,591,949 | 5/1986 | Lahr ....................... 361/394 |
| 4,600,326 | 7/1986 | Fudatsuji ............... 400/691 |
| 4,628,413 | 12/1986 | Speraw .................. 361/415 |
| 4,648,007 | 3/1987 | Garner ................... 361/384 |
| 4,652,769 | 3/1987 | Smith ..................... 307/31 |
| 4,674,004 | 6/1987 | Smith ..................... 361/384 |
| 4,738,632 | 4/1988 | Schmidt ................. 439/341 |
| 4,744,005 | 5/1988 | Milani ................... 361/384 |
| 4,748,540 | 5/1988 | Henneberg ............. 361/424 |
| 4,758,925 | 7/1988 | Obata .................... 361/384 |
| 4,911,231 | 3/1990 | Horne ................. 165/104.34 |
| 4,922,125 | 5/1990 | Casanova et al. ..... 307/149 |
| 5,089,937 | 2/1992 | Carruba et al. ....... 361/394 |
| 5,101,320 | 3/1992 | Bhargava .............. 361/384 |

FOREIGN PATENT DOCUMENTS

| | | |
|---|---|---|
| 2613366 | 10/1977 | Fed. Rep. of Germany . |
| 3314978A | 11/1984 | Fed. Rep. of Germany . |
| 2570920 | 9/1985 | France . |
| 57-20458 | 2/1982 | Japan . |

OTHER PUBLICATIONS

Heutschel et al "Range of Modular 6EW1 Power Supply Units," Siemens Power Engineering II (German), No. 8, pp. 238-240, Aug. 1980.

Primary Examiner—William H. Beha, Jr.
Attorney, Agent, or Firm—Townsend and Townsend Khourie and Crew

[57] ABSTRACT

A high density electronic module packaging system includes a cabinet for housing a plurality of modules. Disposed at the rear of the cabinet and forming a rear wall thereof is a cooling system housing that is used for cooling the modules contained in the cabinet Disposed within the cabinet are a plurality, e.g., four, cooling modules; a power distribution unit having a plurality, e.g., twelve, power converters; and a plurality, e.g., twenty-eight electronic modules. The number of cooling modules, power converters and electronic modules may be added or subtracted as needed or desired. The cooling modules flow cooling fluid to and/or from the power distribution unit and/or to the plurality of electronic modules. The power distribution unit supplies power to the plurality of electronic modules. The electronic modules may house one or more submodules such as storage devices (e.g., disk drives) or printed circuit boards.

12 Claims, 8 Drawing Sheets

MODULAR POWER SUPPLY ARRANGEMENT WITH COOLING

This is a continuation of application Ser. No. 07/726,616 filed Jul. 8, 1991, now U.S. Pat. No. 5,207,613.

BACKGROUND OF THE INVENTION

This invention relates to packaging schemes for electronic components and, more particularly, to a high density packaging scheme for a plurality of electronic storage devices or printed circuit boards.

Many modern electronic systems, such as computing systems, are constructed to be modular so that the system may be expanded merely by adding discrete modules to the system. Of course, means must be provided for communicating power and data to and from the plurality of modules. Furthermore, each module must have the capability of dissipating the heat generated by the electronic components contained within it.

Traditionally, each module is provided with its own power supply and cooling system, and the plurality of modules are interconnected by a series of cables. As the number of modules increase, larger and larger amounts of space are needed to accommodate them, and typically the added space required is not cost effective relative to the amount of extra computing power available from each module. This arises in part because much of the space occupied by each module results from the dedicated cooling and power supply that is packaged with each module. Furthermore, the emergence of very small form factor devices and boards make it extremely difficult to efficiently package them in products with practical geometric shapes. For example, devices having dimensions of 2"×4"×6" are difficult to package in a cabinet having a depth of 18" without wasting space or creating access problems. The cabling requirements of such an expanded system also become unmanageable not only because of the massive amounts of wire required to connect all the modules together, but also because the signals are forced to propagate over longer and longer lengths of wire. As a result, the benefits of designing a modular system are lost as the system size increases.

SUMMARY OF THE INVENTION

The present invention is directed to a high density packaging scheme for mounting, cooling, interconnecting and providing power and data to a plurality of electronic modules such as storage devices or printed circuit boards. The system is fault tolerant, linearly expandable, and cost effective.

In one embodiment of the present invention, a cabinet houses a plurality of modules. Disposed at the rear of the cabinet and forming a rear wall thereof is a cooling system housing that is used for cooling the modules contained in the cabinet. Disposed within the cabinet are a plurality, e.g., four, cooling modules; a power distribution unit having a plurality, e.g., twelve power converters; and a plurality, e.g., twenty-eight electronic modules. The number of cooling modules, power converters and electronic modules may be added or subtracted as needed or desired. The cooling modules flow cooling fluid to and/or from the power distribution unit and/or to the plurality of electronic modules. The power distribution unit supplies power to the plurality of electronic modules. The electronic modules may house one or more submodules such as storage devices (e.g., disk drives) or printed circuit boards.

DETAILED DESCRIPTION OF PREFERRED EMBODIMENTS

Figure 1:
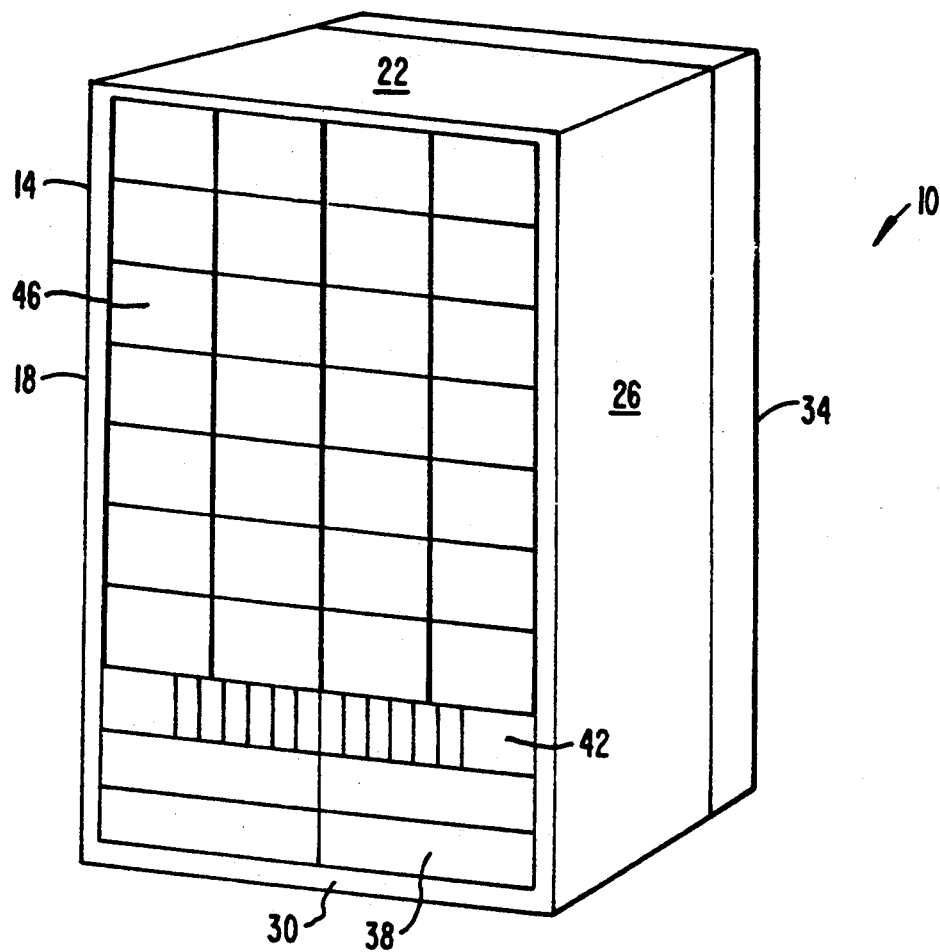
FIG. 1 is a perspective view of a particular embodiment of a high density electronic module packaging system according to the present invention.

FIG. 1 is a perspective view of a high density electronic module packaging system 10 according to the present invention. The packaging system 10 includes a cabinet 14 comprising walls 18, 22, 26 and 30 for housing a plurality of modules. Disposed at the rear of cabinet 14 and forming a rear wall thereof is a cooling system housing 34 that is used for cooling the modules contained in cabinet 14. Disposed within cabinet 14 are a plurality, e.g., four, cooling modules 38; a power distribution unit 42 having a plurality, e.g., twelve power converters 44; and a plurality, e.g., twenty-eight electronic modules 46 stacked as shown. The number of cooling modules 38, power converters 44 and electronic modules 46 may be added or subtracted as needed or desired. Cooling modules 38 flow cooling fluid to and/or from power distribution unit 42 and/or to the plurality of electronic modules 46. Power distribution unit 42 supplies power to the plurality of electronic modules 46. Modules 46 may house one or more submodules such as storage devices (e.g., disk drives) or printed circuit boards.

COOLING SYSTEM

Figure 2:
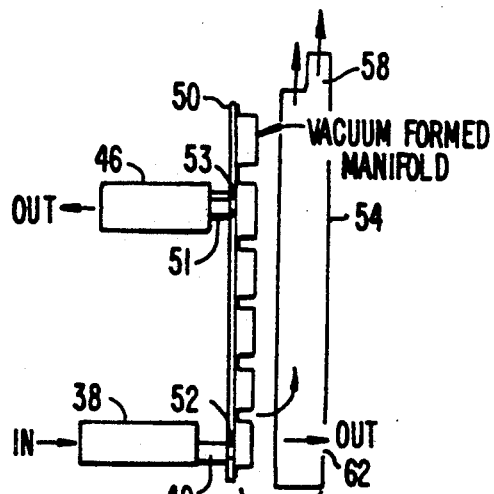
FIG. 2 is a side view of a particular embodiment of a cooling system which may be used in the packaging system shown in FIG. 1.

FIG. 2 is a side cross-sectional view of a particular embodiment of housing 34 showing the general theory of operation of the cooling system. In general, the cooling system comprises a plurality of cooling modules 38

(preferably air moving devices) that are plugged into a shared air/cooling distribution system such as housing 34. Housing 34 may comprise various manifolds, hoses, plenums, or baffles dictated by the application. Cooling modules 38 may provide either positive or negative pressure or both. The number of cooling modules 38 should be selected so that when a cooling module fails, sufficient capacity is still available from the remaining modules. Thus, the cooling system is fault tolerant, but total redundancy is not required, and excess costs associated with designing overcapacity are eliminated.

Electronic modules 44 are plugged into ports or valves in the housing. The ports or valves open for allowing the flow of cooling fluid to or from its associated electronic module 46 when the module is plugged in, and then close when no module is present to conserve the cooling fluid and to allow for recirculation. As more electronic modules 46 are added, more cooling modules 38 are added to increase the overall system cooling capacity. The centralized cooling system eliminates the need for a separate cooling system for each electronic module, so a substantial space saving results.

Figure 3:
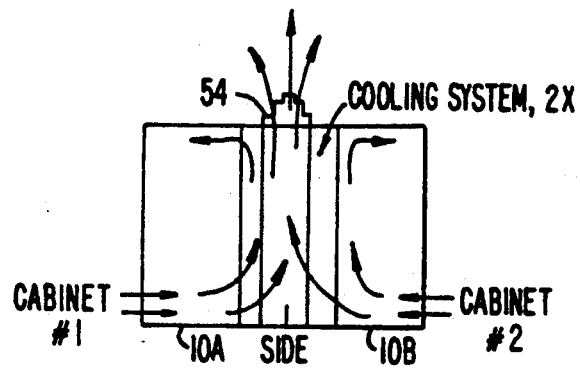
FIG. 3 is a side view of an alternative embodiment of a cooling system which may be used with the packaging system shown in FIG. 1.

In the embodiment shown in FIG. 2, housing 34 comprises a vacuum formed manifold 50 which may be in fluid communication with an exhaust stack 54. Each cooling unit 38 has a conduit 49 that communicates cooling fluid (e.g., air) into manifold 50 through one of a plurality of cooling fluid source openings 52, and the air is communicated to electronic module 46 through a conduit 51 that is plugged into one of a plurality of cooling fluid distribution openings 53. The air thereafter passes through and out of the module 46 as shown. The air that is not passed through module 46 is communicated into exhaust stack 54 and may be expelled either through a chimney 58 or through an exhaust opening 62 in the back of exhaust stack 54. When chimney 58 is used, then the alternative embodiment of the packaging system 10 shown in FIG. 3 may be constructed. In this embodiment, two packaging systems 10A and 10B are shown placed back-to-back against exhaust stack 54, thus increasing the space efficiency of the system.

Figure 4:
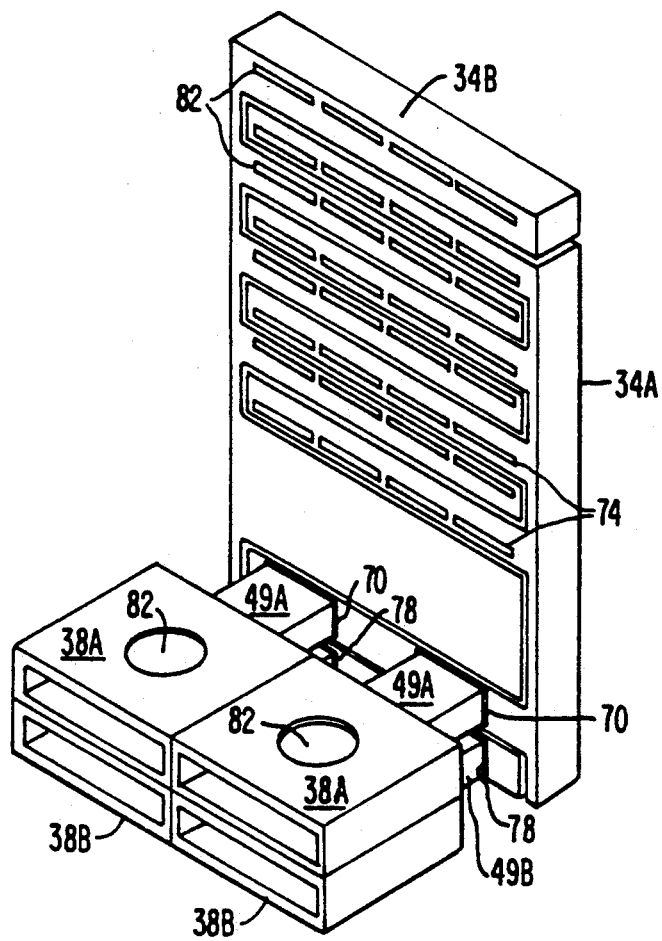
FIG. 4 is a perspective view of an alternative embodiment of a cooling system which may be used in the packaging system shown in FIG. 1.

FIG. 4 is a perspective view of an alternative embodiment of the cooling system. In this embodiment, housing 34 defines a cooling fluid intake chamber 34A and a cooling fluid exhaust chamber 34B. Cooling fluid intake chamber 34A includes a plurality of cooling fluid intake openings 70 for receiving cooling fluid from positive pressure cooling fluid modules 38A through conduits 49A, and a plurality of cooling fluid distribution intake openings 74 for distributing cooling fluid to a plurality of electronic modules. Similarly, cooling fluid exhaust chamber 34B includes a plurality of cooling fluid exhaust openings 78 for communicating cooling fluid to a plurality of negative pressure cooling fluid modules 38B through conduits 49B, and a plurality of cooling fluid distribution exhaust openings 82 for receiving cooling fluid from the plurality of electronic modules. Each positive pressure cooling fluid module 38A includes a power supply cooling opening 82 oriented generally perpendicularly to conduit 49A for providing direct cooling of power distribution unit 42 (See FIG. 5).

Figure 5:
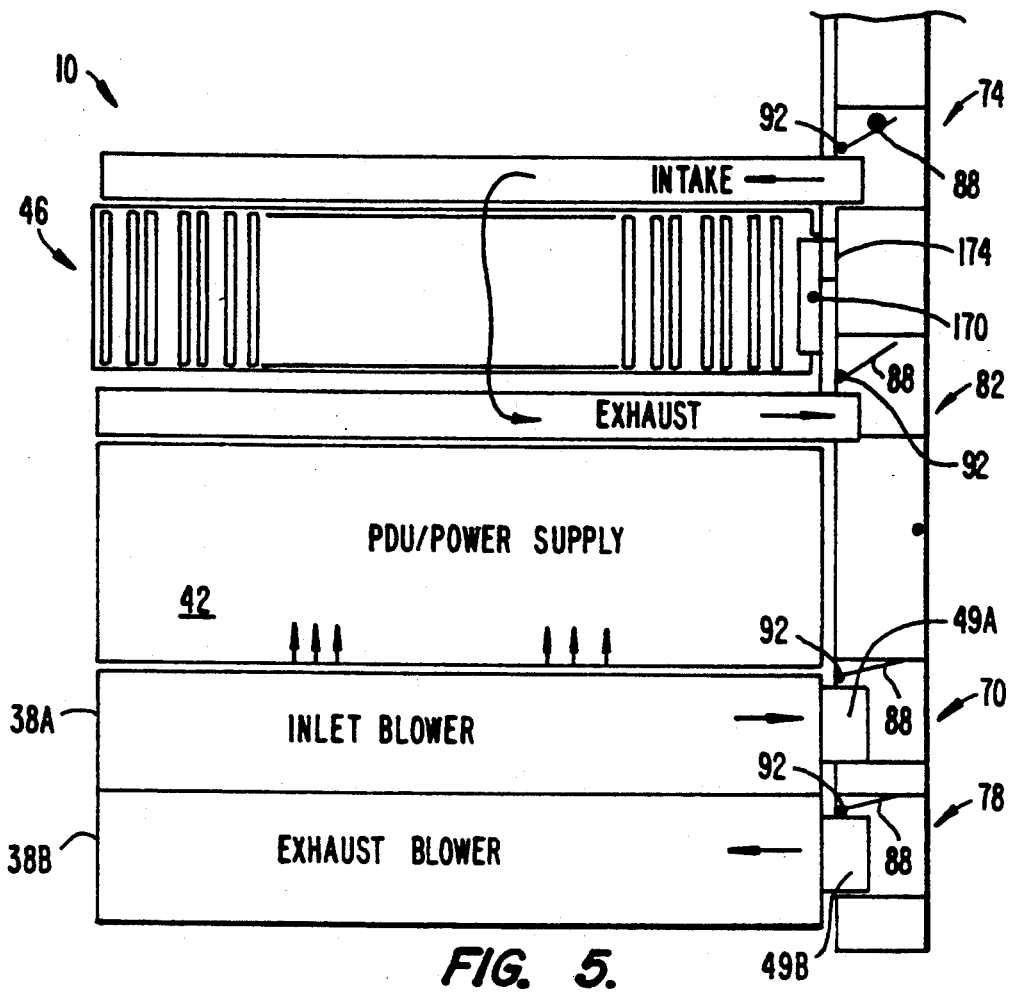
FIG. 5 is a side view of the cooling system of FIG. 4 showing how cooling is provided to other components within the packaging system.

FIG. 5 is a side view of a portion of module packaging system 10 showing the cooling system of FIG. 4 in more detail. Each cooling fluid intake opening 70, cooling fluid exhaust opening 78, cooling fluid distribution intake opening 74, and cooling fluid distribution exhaust opening 82 includes a valve mechanism comprising a panel 88 that is biased toward its respective opening by a spring 92. When no module is present, panel 88 closes off its associated opening, thus preserving the cooling fluid within the housing. Cooling modules 38A and 83B are plugged into chambers 34A and 34B by extending conduits 49A and 49B into their respective openings. This pushes panels 88 away from openings 70 and 78 and allows the flow of cooling fluid therethrough. The same valve mechanism is used in the embodiment shown in FIG. 2.

Cooling fluid from positive pressure cooling fluid module 38A is communicated into intake chamber 34A through cooling fluid intake opening 70 and circulated toward cooling fluid distribution intake opening 74. The cooling fluid enters module 46 through cooling fluid distribution intake opening 74, passes through module 46, and exits module 46 through cooling fluid distribution exhaust opening 82. The cooling fluid then passes through cooling fluid exhaust opening 78 and into the negative pressure cooling fluid unit 38B. Module 46 may or may not be sealed from the external environment depending upon whether a substantially closed circulation path of cooling fluid is desired.

POWER DISTRIBUTION MODULE

Figure 6:
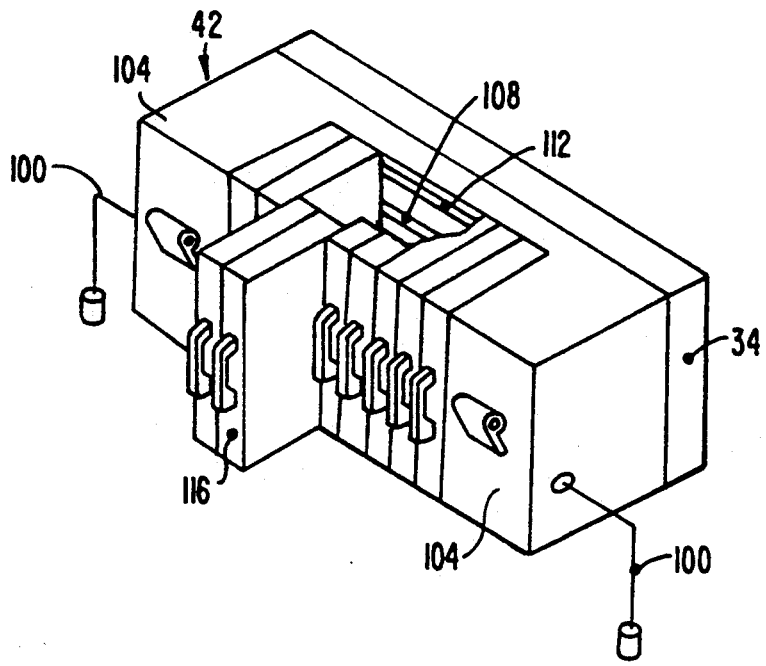
FIG. 6 is a perspective view of an expandable power distribution system which may be used in the packaging system shown in FIG. 1.

FIG. 6 is a perspective view of power distribution unit 42. Power distribution unit 42 includes a pair of AC or DC input lines 100, a circuit breaker/EMI filter unit 104 associated with each input line 100 for filtering the AC or DC input signal, an input bus 108 coupled to housing 34 for distributing the filtered AC or DC signal to a plurality of pluggable AC-to-AC, AC-to-DC or DC-to-DC converters 116, and a power distribution bus 112 coupled to housing 34 for distributing the common output power from converters 116. Power distribution bus 112 may branch into multiple segments 112A, 112B, etc., to provide the desired distribution paths to various parts of the cabinet. The converters are releasably coupled to busses 108 and 112 using conventional power bus coupling mechanisms.

The number of converters 116 provided may be determined by the desired application and the native control intelligence of the converters to minimize entry level costs and maximize expansion capabilities. Each additional converter 116 adds to the overall power capacity of the system. As with the cooling system, a larger number of converters is used than is required to provide for fault tolerance in the event of a failure, but full redundancy is not required.

Figure 7:
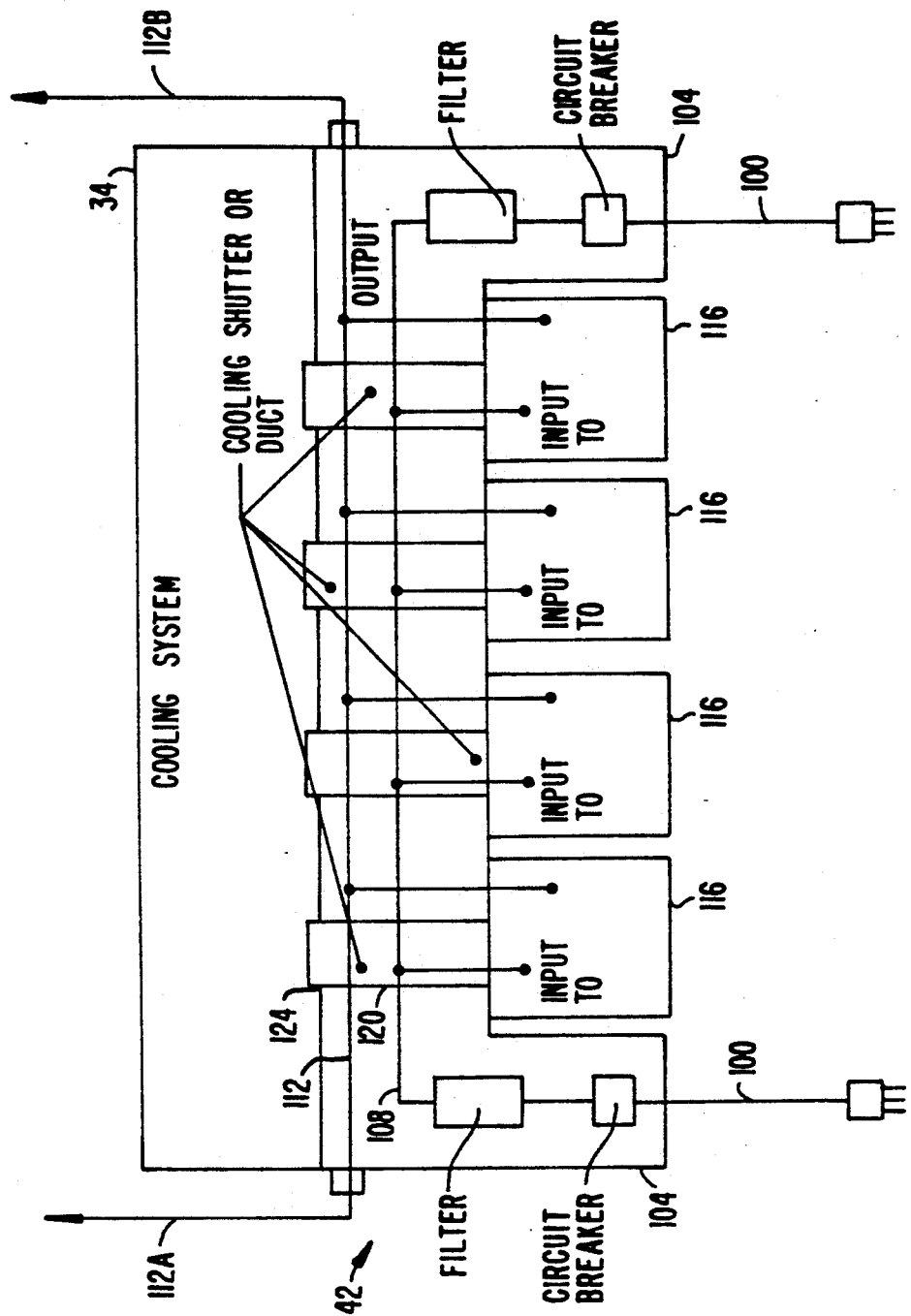
FIG. 7 is a top view of an alternative embodiment of the power distribution system shown in FIG. 6.

The bottom of power distribution unit 42 may be apertured or open to receive cooling fluid from openings 82 in cooling units 38. Alternatively, FIG. 7 shows an embodiment of power distribution unit 42 wherein cooling fluid may be obtained from housing 34 through cooling ducts 120 rather than directly from the cooling units 38. In this embodiment, cooling ducts 120 extend from each converter 116 for engaging openings 124 in housing 34 in a manner similar to that shown in FIG. 2. Of course, the closed loop cooling method shown in FIGS. 4 and 5 also may be used by providing appropriate intake and exhaust chambers as discussed below for the electronic module.

ELECTRONIC MODULE

Figure 8:
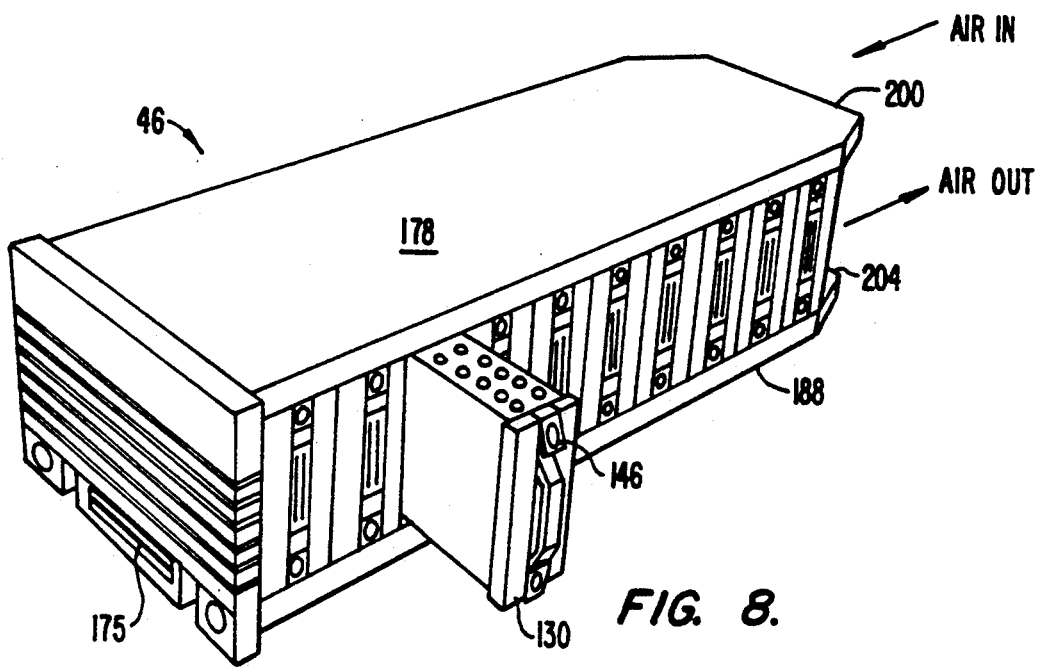
FIG. 8 is a perspective view of one of the plurality of electronic modules which may be mounted in the packaging system shown in FIG. 1.
Figure 9:
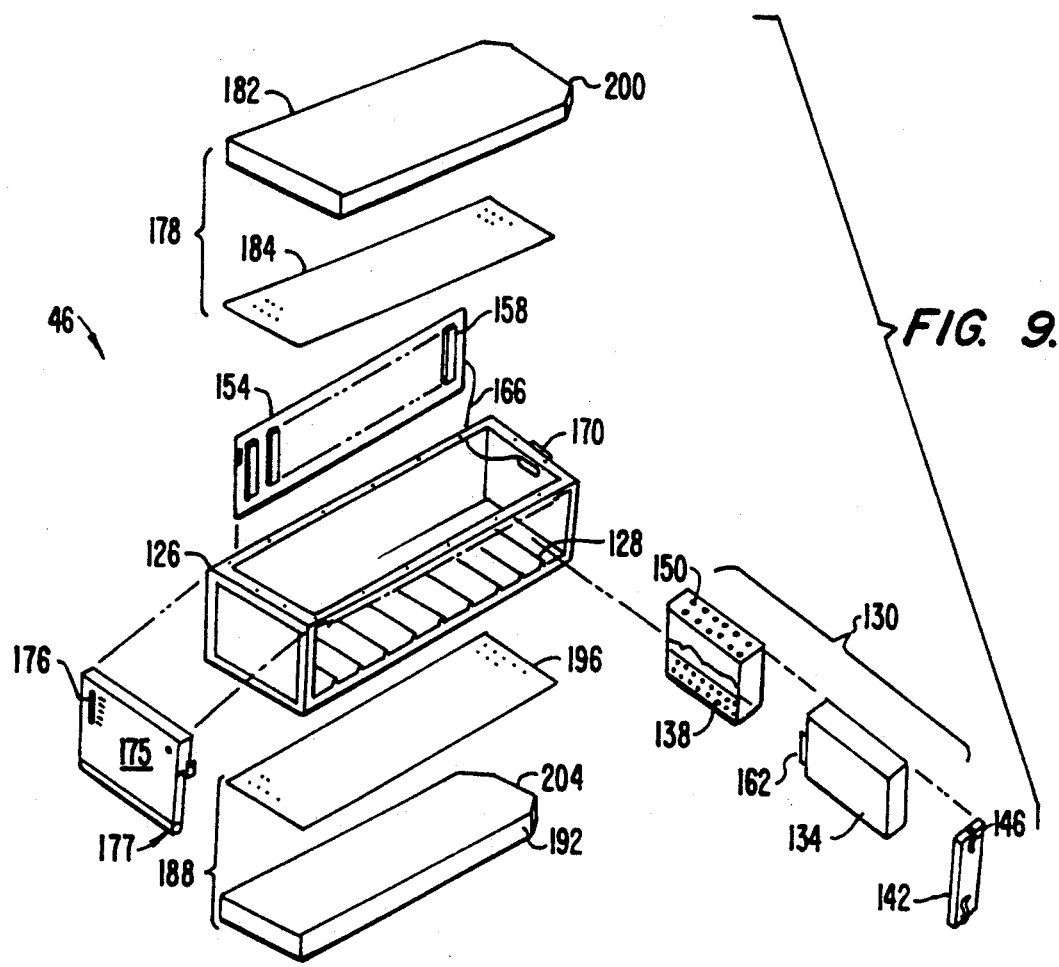
FIG. 9 is an exploded view of the electronic module shown in FIG. 8.

FIGS. 8-9 are perspective and exploded views, respectively, of a particular embodiment of an electronic module 46 according to the present invention. In this embodiment, module 46 is constructed for use with the closed loop cooling system shown in FIGS. 4 and 5.

Module 46 comprises a module housing 126 (FIG. 9) having slots 128 for housing a plurality of submodules 130 which, in this embodiment, each comprises a disk drive 134 contained within a drive shroud 138. A drive cover 142 having ejectors 146 maintains each submodule 130 in place within electronic module 46. The upper and lower surfaces of drive shroud 138 have perforations 150 therein or are otherwise open for allowing the cooling fluid to pass by disk drive 134.

A backplane 154 is disposed on the rear of housing 126. Backplane 154 includes drive connectors 158 which releasably mate with a complimentary connector 162 on the rear of disk drive 134. Connectors 158 are interconnected through a bus 166 which, in turn, is connected to a connector 170. Connector 170 releasably couples to a complementary connector 174 (FIG. 5) on cooling housing 34 which supplies power from power distribution bus 112 and communicates data to and from module 46. A front cover or control panel 175 is disposed on the side of housing 126. Control panel 175 may include indicator lights and/or switches 176 and external parts of an ejector mechanism such as ejector handle 177.

A cooling fluid intake housing 178 comprising a cover plenum 182 and an orifice plate 184 is disposed on the upper part of module housing 126, and a cooling fluid exhaust housing 188 comprising a base plenum 192 and an orifice plate 196 is disposed on the bottom of module housing 126. Cover plenum 182 includes a cooling fluid entry opening 200 for communicating cooling fluid from housing 34 to the cooling fluid intake chamber. Similarly, cooling fluid exhaust housing 188 includes a cooling fluid exit opening 204 for communicating cooling fluid from the cooling fluid exhaust chamber back to housing 34.

Figure 10:
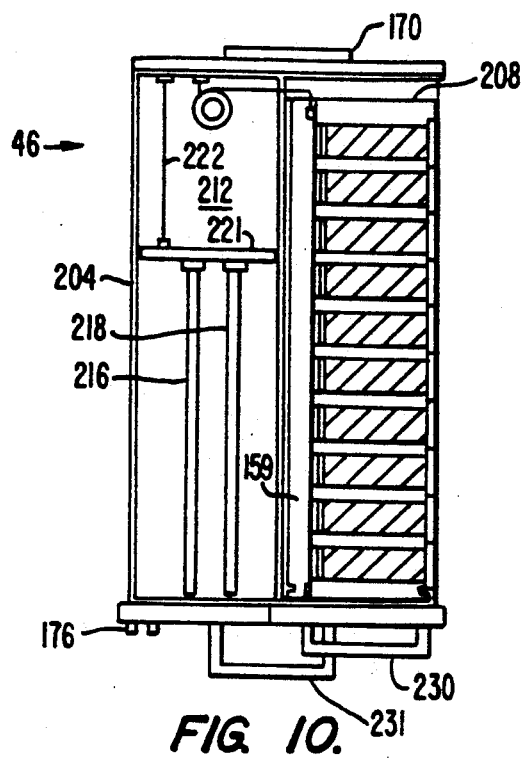
FIGS. 10 and 11 show an alternative embodiment of the electronic module shown in FIG. 8.
Figure 11:
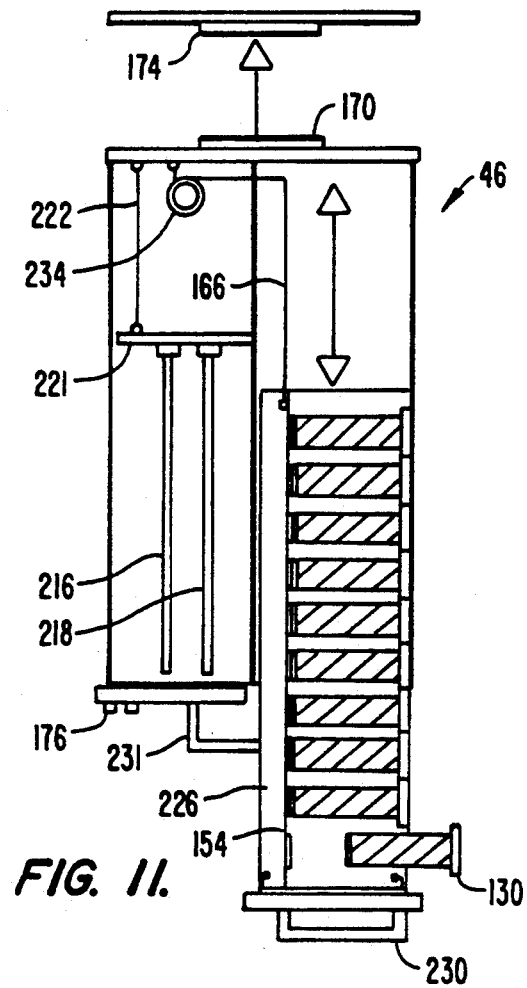

FIGS. 10-11 are top views of an alternative embodiment of electronic module 46. The components which are the same as those shown in FIGS. 8 and 9 are numbered the same. Although not shown, the same cooling fluid intake housing and cooling fluid exhaust housing may be used. In this embodiment, a housing 204 comprises a drive section 208 and a controller section 212. Controller section 212 includes controller cards 216, 218 which are interconnected through a controller backplane 221 and a bus 222 which, in turn, is electrically coupled to connector 170. Disposed within drive section 208 is a slidable carriage 226 which includes submodules 130 and backplane 154. Carriage 226 may be drawn from housing 204 by pulling on a handle 230, and the entire module 46 may be removed from cabinet 14 by pulling on a handle 231. In this embodiment, bus 166 may be formed into a service loop or passed around a retraction mechanism 234 to allow carriage 226 to be drawn from housing 204 without electrically disconnecting submodules 130. The slidable carriage 226 and retractable bus 166 facilitate on-line servicing without sacrificing package density since a single submodule 130 may be removed without disturbing the operation of the remaining devices.

Figure 12:
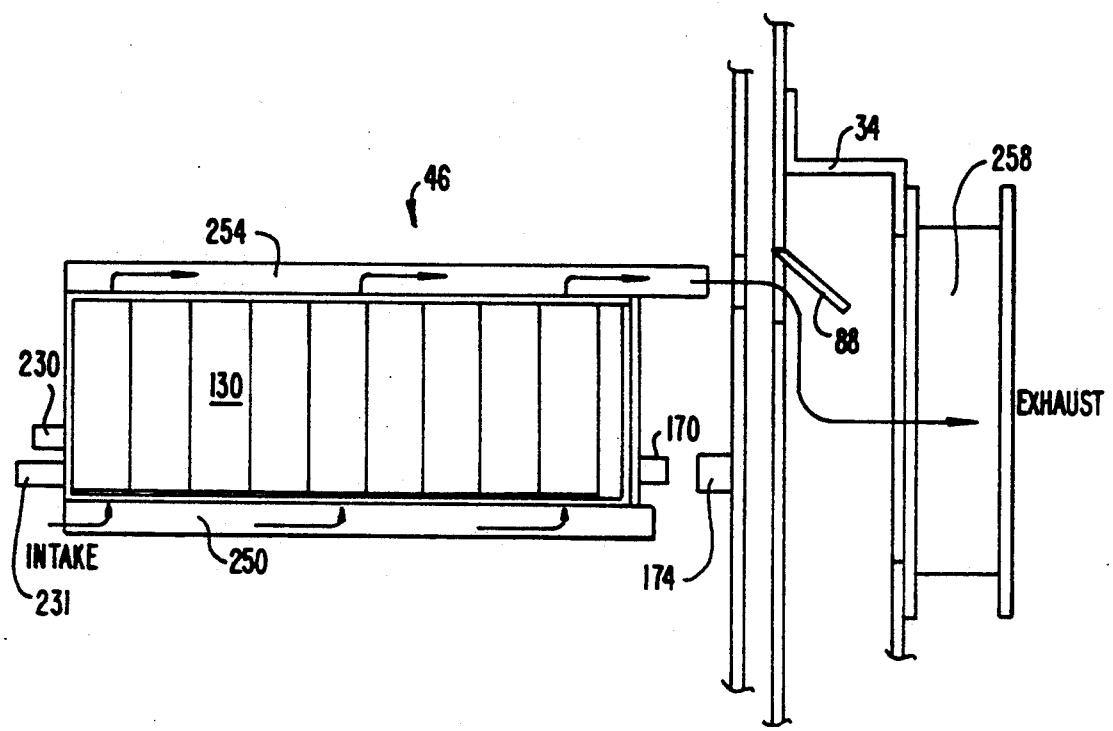
FIG. 12 is a side view of an alternative embodiment of the module packaging system shown in FIGS. 10-11.

FIG. 12 is a side view of an alternative embodiment of the module packaging system shown in FIGS. 10-11 wherein cooling fluid enters a cooling fluid intake housing 250 near handles 230 and 231 and thereafter flows through modules 130, into a cooling fluid exhaust housing 254 and into cooling system housing 34. In this embodiment, cooling system housing 34 includes a cooling fluid, e.g., air, fan 258 which draws cooling fluid from module 46. Of course, the cooling modules 38 discussed earlier may be used for this purpose as well.

Figure 13:
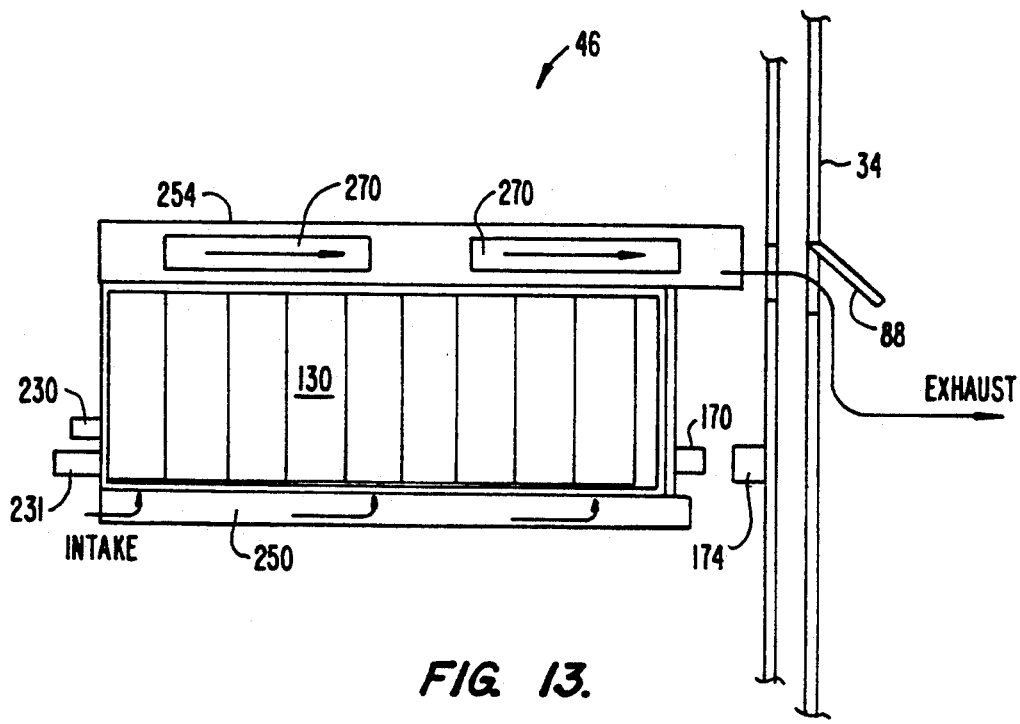
FIG. 13 is a side view of another alternative embodiment of the module packaging system shown in FIGS. 10-11.

FIG. 13 is a side view of another alternative embodiment of module 46 wherein cooling fluid exhaust housing 254 includes rotary blowers 270 for drawing cooling fluid from cooling fluid intake chamber 250 and through modules 130, and for directing the cooling fluid into cooling system housing 34.

Figure 14:
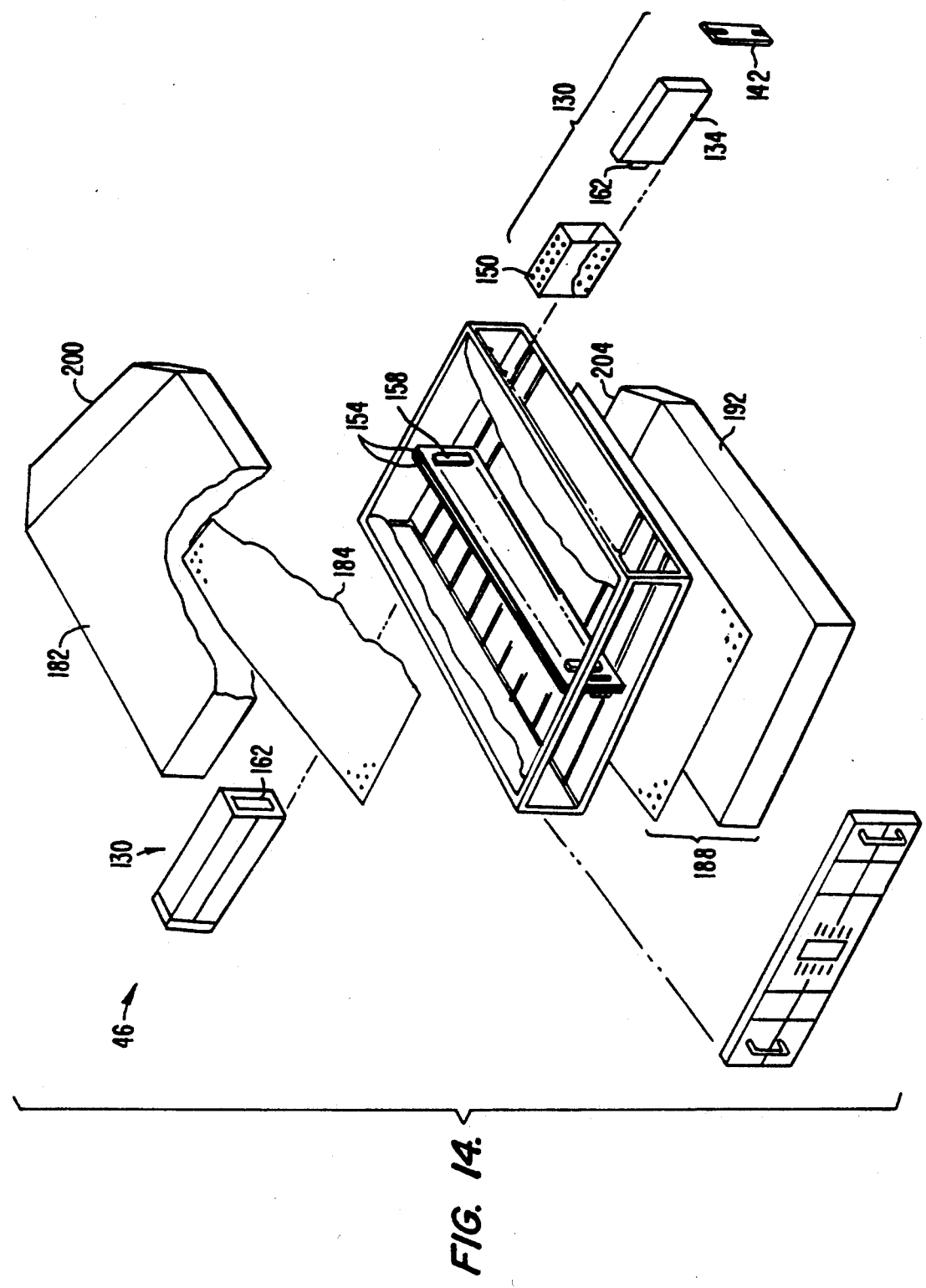
FIG. 14 is an exploded view of an alternative embodiment of the module packaging system shown in FIG. 8.

FIG. 14 is an exploded view of another alternative embodiment of an electronic module 46 according to the present invention. Once again, the components which are the same as those shown in FIGS. 8 and 9 are numbered the same. In this embodiment, two rows of submodules are placed back-to-back.

While the above is a complete description of a preferred embodiment of the present invention, various modifications may be employed. Consequently, the scope of the invention should not be limited except as described in the claims.

What is claimed is:

1. An apparatus for supplying power to an electronic module comprising:
   a housing defining a chamber;
   AC input means for receiving a source of alternating current;
   an AC input bus affixed to the housing and coupled to the AC input means for receiving alternating current from the AC input means;
   a power distribution bus affixed to the housing for supplying power to the electronic module;
   coupling means for releasably coupling a plurality of power modules to the AC input bus and to the power distribution bus so that each power module receives alternating current from the AC input bus and provides power to the distribution bus in common with the other power modules;
   wherein the housing includes a plurality of cooling fluid distribution openings in fluid communication with the chamber for distributing cooling fluid to the plurality of power supplies;
   distribution valve means, disposed at each cooling fluid distribution opening, for allowing the flow of cooling fluid through its associated distribution opening and for preventing the flow of cooling fluid through the distribution opening when the power module is not disposed at the distribution opening;
   wherein the housing includes a plurality of cooling fluid source openings in fluid communication with the chamber for receiving cooling fluid from a cooling source module; and
   source valve means, disposed at each cooling fluid source opening, for allowing the flow of cooling fluid through its associated source opening when a cooling source module is disposed at the source opening and for preventing the flow of cooling fluid through the source opening when the cooling source module is not disposed at the source opening.

2. The apparatus according to claim 1 wherein the AC input means comprises a filter for filtering the alternating current.

3. The apparatus according to claim 1 wherein the distribution valve means comprises:
   a first panel pivotally mounted in close proximity to an associated distribution opening; and
   biasing means, coupled to the first panel, for biasing the first panel toward the distribution opening when the power module is not disposed at the distribution opening so that the distribution opening is closed off for preventing the flow of cooling fluid therethrough.

4. The apparatus according to claim 3 wherein the biasing means comprises a spring.

5. The apparatus according to claim 4 wherein the source valve means comprises:
   a second panel pivotally mounted in close proximity to an associated source opening; and
   biasing means, coupled to the second panel, for biasing the second panel toward the source opening when the cooling source module not disposed at the source opening so that the source opening is closed off for preventing the flow of cooling fluid therethrough.

6. An apparatus for supplying power to a plurality of electronic modules comprising:
   a housing defining a chamber;
   AC input means for receiving a source of alternating current;
   an AC input bus affixed to the housing and coupled to the AC input means for receiving alternating current from the AC input means;
   a power distribution bus affixed to the housing for supplying power to the plurality of electronic modules;
   a plurality of power modules;
   coupling means for releasably coupling the plurality of power modules to the AC input bus and to the power distribution bus so that each power module receives alternating current from the AC input bus and provides power to the distribution bus in common with the other power modules;
   wherein the housing includes a plurality of cooling fluid distribution openings in fluid communication with the chamber for distributing cooling fluid to the plurality of power supplies;
   distribution valve means, disposed at each cooling fluid distribution opening, for allowing the flow of cooling fluid through its associated distribution opening when a power module is disposed at the distribution openign and for preventing the flow of cooling fluid through the distribution opening when the power module is not disposed at the distribution opening;
   wherein the housing includes a plurality of cooling fluid source openings in fluid communication with the chamber for receiving cooling fluid from a cooling source module; and
   source valve means, disposed at each cooling fluid source opening, for allowing the flow of cooling fluid through its associated source opening when a cooling source module is disposed at the source opening and for preventing the flow of cooling fluid through the source opening when the cooling source module is not disposed at the source opening.

7. The apparatus according to claim 6 wherein each power module comprises an AC-to-DC converter, and wherein the power distribution bus supplies direct current power to the plurality of electronic modules.

8. The apparatus according to claim 6 wherein the distribution bus branches into a plurality of bus segments.

9. The apparatus according to claim 6 wherein the AC input means comprises a filter for filtering the alternating current.

10. The apparatus according to claim 6 wherein the distribution valve means comprises:
    a first panel pivotally mounted in close proximity to an associated distribution opening; and
    biasing means, coupled to the first panel, for biasing the first panel toward the distribution opening when the power module is not disposed at the distribution opening so that the distribution opening is closed off for preventing the flow of cooling fluid therethrough.

11. The apparatus according to claim 10 wherein the biasing means comprises a spring.

12. The apparatus according to claim 11 wherein the source valve means comprises:
    a second panel pivotally mounted in close proximity to an associated source opening; and
    biasing means, coupled to the second panel, for biasing the second panel toward the source opening when the cooling source module is not disposed at the source opening so that the source opening is closed off for preventing the flow of cooling fluid therethrough.

* * * * *